US008664749B2

United States Patent
Wu et al.

(10) Patent No.: US 8,664,749 B2
(45) Date of Patent: Mar. 4, 2014

(54) COMPONENT STACKING USING PRE-FORMED ADHESIVE FILMS

(75) Inventors: Weng-Jin Wu, Hsin-Chu (TW); Hung-Jung Tu, Hualien (TW); Ku-Feng Yang, Dali (TW); Jung-Chih Hu, Yangmei Township (TW); Wen-Chih Chiou, Miaoli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 401 days.

(21) Appl. No.: 13/084,204

(22) Filed: Apr. 11, 2011

(65) Prior Publication Data

US 2011/0186967 A1 Aug. 4, 2011

Related U.S. Application Data

(62) Division of application No. 12/329,322, filed on Dec. 5, 2008, now Pat. No. 7,943,421.

(51) Int. Cl.
*H01L 23/31* (2006.01)

(52) U.S. Cl.
USPC .... 257/648; 257/777; 257/778; 257/E21.511; 257/E21.513

(58) Field of Classification Search
USPC ........... 257/684, 777, 778, E21.511, E21.513
See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,093,708 A * | 3/1992 | Solomon | 257/700 |
| 5,380,681 A | 1/1995 | Hsu | |
| 5,481,133 A | 1/1996 | Hsu | |
| 6,002,177 A | 12/1999 | Gaynes et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,713,857 B1 | 3/2004 | Tsai | |
| 6,762,076 B2 | 7/2004 | Kim et al. | |

(Continued)

FOREIGN PATENT DOCUMENTS

| | | |
|---|---|---|
| CN | 101232008 A | 7/2008 |
| JP | 2004349275 A | 12/2004 |
| TW | 200919603 A | 5/2009 |

*Primary Examiner* — George Fourson, III
(74) *Attorney, Agent, or Firm* — Slater & Matsil, L.L.P.

(57) ABSTRACT

A method of forming integrated circuits includes laminating a patterned film including an opening onto a wafer, wherein a bottom die in the wafer is exposed through the opening. A top die is placed into the opening. The top die fits into the opening with substantially no gap between the patterned film and the top die. The top die is then bonded onto the bottom die, followed by curing the patterned film.

20 Claims, 7 Drawing Sheets

(56) References Cited

U.S. PATENT DOCUMENTS

| | | |
|---|---|---|
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 7,838,979 B2 * | 11/2010 | Oh ........................ 257/686 |
| 7,943,421 B2 | 5/2011 | Wu et al. |
| 2002/0135080 A1 | 9/2002 | Bai |
| 2003/0057563 A1 * | 3/2003 | Nathan et al. ................. 257/777 |
| 2006/0175697 A1 * | 8/2006 | Kurosawa et al. ........... 257/686 |
| 2008/0029879 A1 | 2/2008 | Tuckerman et al. |
| 2008/0315407 A1 * | 12/2008 | Andrews et al. .............. 257/735 |
| 2009/0065902 A1 | 3/2009 | Yu et al. |
| 2009/0283890 A1 | 11/2009 | Karnezos |
| 2009/0321954 A1 * | 12/2009 | Oh ................. 257/777 |
| 2010/0084681 A1 | 4/2010 | Nakajima et al. |
| 2010/0311226 A1 | 12/2010 | Hamasaki et al. |
| 2013/0032952 A1 * | 2/2013 | Cho et al. ...................... 257/777 |

* cited by examiner

COMPONENT STACKING USING PRE-FORMED ADHESIVE FILMS

This application is a divisional of U.S. patent application Ser. No. 12/329,322, entitled "Component Stacking Using Pre-Formed Adhesive Films," filed Dec. 5, 2008, which application is hereby incorporated herein by reference.

TECHNICAL FIELD

This invention relates generally to integrated circuit manufacturing processes, and more particularly to methods for bonding semiconductor dies onto wafers.

BACKGROUND

With the evolution of semiconductor technologies, semiconductor dies are becoming increasingly smaller. However, more functions need to be integrated into the semiconductor dies. Accordingly, the semiconductor dies need to have increasingly greater numbers of I/O pads packed into smaller areas, and the density of the I/O pads rises quickly. As a result, the packaging of the semiconductor dies becomes more difficult, which adversely affects the yield.

Package technologies can be divided into two categories. One category is typically referred to as wafer level package (WLP), wherein dies on a wafer are packaged before they are sawed. WLP technology has some advantages, such as greater throughput and lower cost. Further, less under-fill and/or molding compound is needed. However, WLP suffers from drawbacks. As aforementioned, the sizes of the dies are becoming increasingly smaller, and the conventional WLP can only be fan-in type packages, in which the I/O pads of each die are limited to a region directly over the surface of the respective die. With the limited areas of the dies, the number of the I/O pads is limited due to the limitation of the pitch of the I/O pads. For example, if the pitch of the I/O pads is to be decreased, solder bridges may occur. Additionally, under the fixed-ball-size requirement, solder balls must have a certain size, which in turn limits the number of solder balls that can be packed on the surface of a die.

In the other category of packaging, dies are sawed from wafers before they are packaged onto other wafers, and only "known-good-dies" are packaged. An advantageous feature of this packaging technology is the possibility of forming fan-out chip packages, which means the I/O pads on a die can be redistributed to a greater area than the die itself, and hence the number of I/O pads packed on the surfaces of the dies can be increased.

The bonding of dies to wafers includes dielectric-to-dielectric bonding (also referred to as fusion bonding), copper-to-copper bonding, and solder bonding. FIG. 1 illustrates a solder bonding scheme, wherein top die 100 is bonded onto bottom die 200 (which may be in a bottom wafer) through solder balls 106, which are placed between bond pads 104 and 204. A reflow is then performed to melt solder balls 106. In the case solder balls 106 are big enough, this bonding process is self-aligned, since the melted solder balls 106 may help the alignment of bond pads 104 with the respective bond pads 204, as is shown in FIG. 2.

In the case copper-to-copper direct bonding is performed, or in the case solder balls 106 are not big enough, there will be no self-alignment effect. Referring to FIG. 3, top die 100 is bonded onto bottom die 200 with bond pads 104 and 204 contacting each other directly, or bonded through very thin solder films (not shown). If bond pads 104 are misaligned with bond pads 204, the misalignment cannot be corrected by the subsequent reflow, if any. Therefore, each of the top dies has to be aligned to the bottom wafer accurately. This requires that the bonding of each of the top dies be accompanied by an alignment step. The throughput is thus significantly reduced.

In addition to the above-discussed problems, the conventional die-to-wafer bonding suffers from reliability issues. Referring to FIG. 4, after top dies 100 are bonded onto bottom wafer 300, molding compound 302 is filled into the gaps between top dies 100. Molding compound 302 is filled in the form of liquid, and is then solidified, for example, by annealing. During the filling of molding compound 302, bubbles 304 may be generated. Bubbles 304 may result in two consequences. First, in the subsequent die-thinning, bubbles 304 may cause the breakage of top dies 100. Second, if a vacuum is needed in the subsequent process, for example, when a chemical vapor deposition (CVD) step or a physical vapor deposition (PVD) step is involved, bubbles 304 may expand and hence result in damage to devices. New bonding methods are thus needed to improve throughput without incurring the above-discussed problems.

SUMMARY OF THE INVENTION

In accordance with one aspect of the present invention, a method of forming integrated circuits includes laminating a patterned film including an opening onto a wafer, wherein a bottom die in the wafer is exposed through the opening. A top die is placed into the opening. The top die fits into the opening with substantially no gap between the patterned film and the top die. The top die is then bonded onto the bottom die, followed by curing the patterned film.

In accordance with another aspect of the present invention, a method of forming integrated circuits includes providing a wafer including a plurality of bottom dies; and patterning a film to form a plurality of openings in the film. The plurality of openings has positions aligned to positions of the plurality of bottom dies. Each of the plurality of openings extends from one side to an opposite side of the film. The patterned film is laminated onto the wafer, with each of the plurality of openings in the film being aligned to one of the plurality of bottom dies.

In accordance with yet another aspect of the present invention, a method of forming integrated circuits includes etching a top surface of a top wafer along scribe lines of the top wafer; polishing a back surface of the top wafer to separate the top wafer into a plurality of top dies; and patterning a film to form a plurality of openings in the film, wherein the plurality of openings has positions corresponding to positions of a plurality of bottom dies in a bottom wafer. The film is laminated onto the bottom wafer, wherein each of the plurality of openings in the film is aligned to one of the plurality of bottom dies. Each of the plurality of top dies is placed into one of the plurality of openings. After all of the plurality of top dies are placed in the plurality of openings, the plurality of top dies is bonded onto the bottom wafer. The film is then cured.

In accordance with yet another aspect of the present invention, an integrated circuit structure includes a bottom die; and a top die bonded onto the bottom die, wherein the top die has a slanted edge. A filler material is on the bottom die and encircles the top die.

The advantageous features of the present invention include self-alignment resulting from accurate alignment of the patterned adhesive film with the bottom wafer, and hence quick pick-and-place may be performed. Top dies are automatically aligned to respective bottom dies. The throughput of the bonding process is thus significantly increased.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method of bonding dies onto a wafer is provided. The intermediate stages of performing a preferred embodiment of the present invention are illustrated. Throughout the various views and illustrative embodiments of the present invention, like reference numbers are used to designate like elements.

Figure 1:
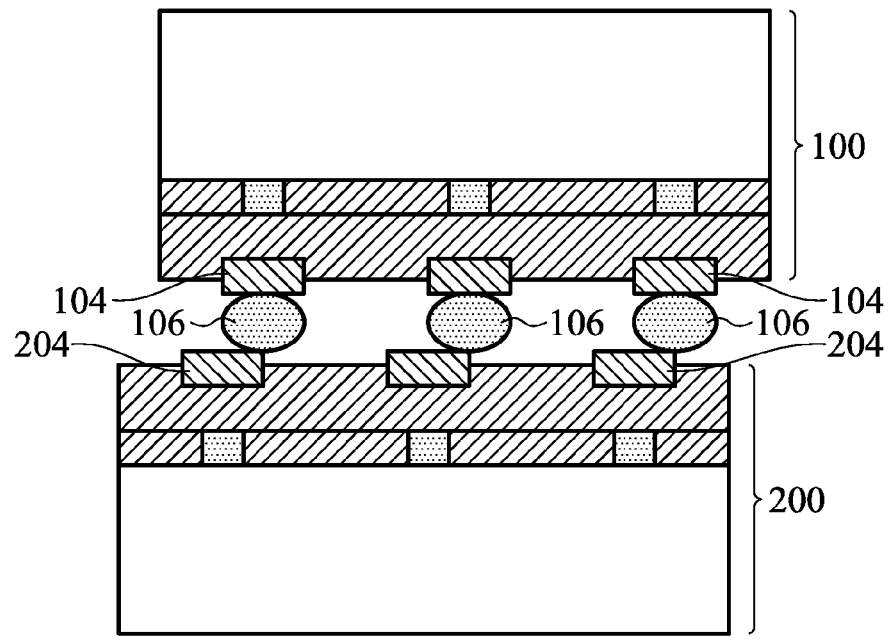
FIGS. 1 and 2 illustrate a conventional solder bonding process, wherein top dies are bonded onto bottom dies by resorting to the self-alignment caused by the reflow of solder balls.
Figure 2:
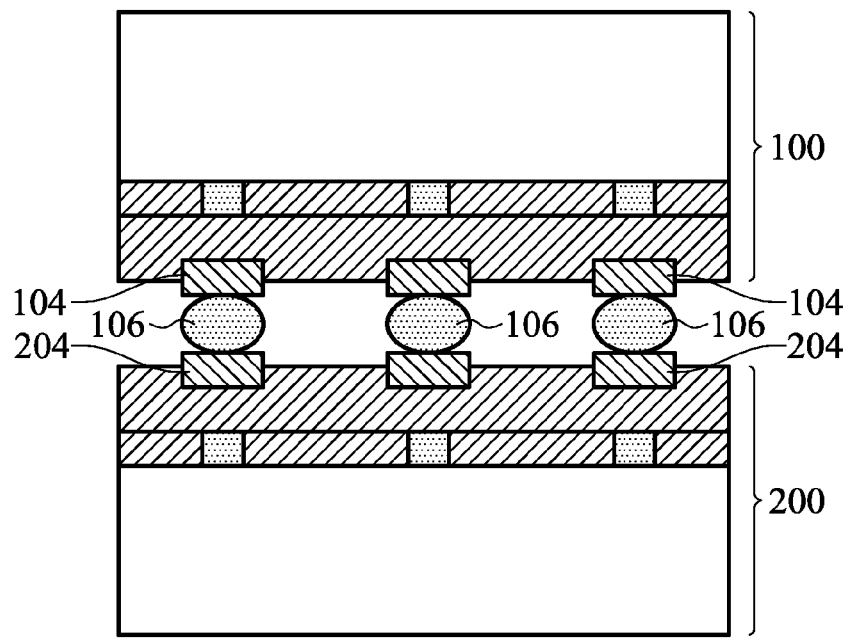
Figure 3:
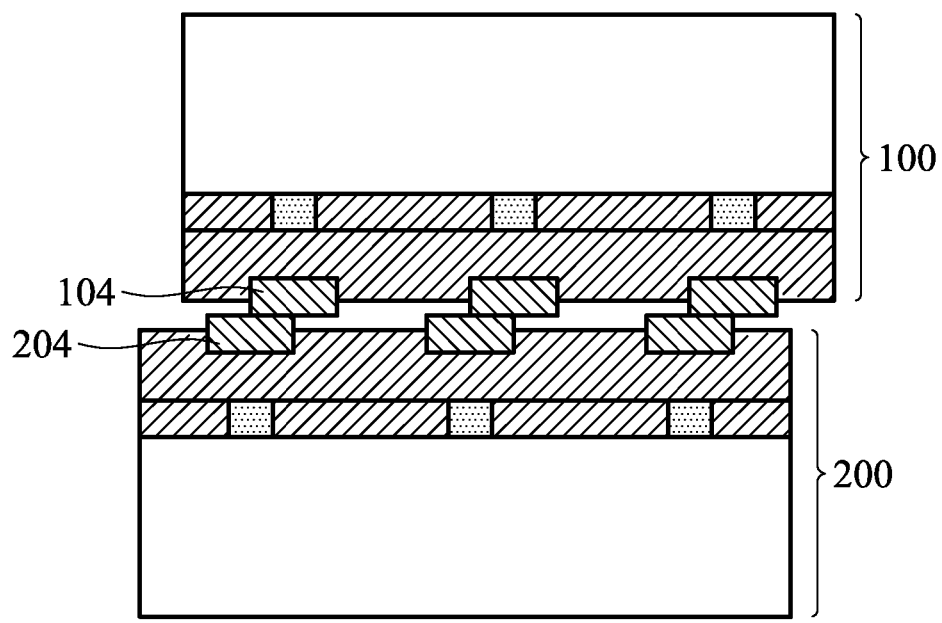
FIG. 3 illustrates a conventional direct copper-to-copper bonding process having a misalignment problem.
Figure 4:
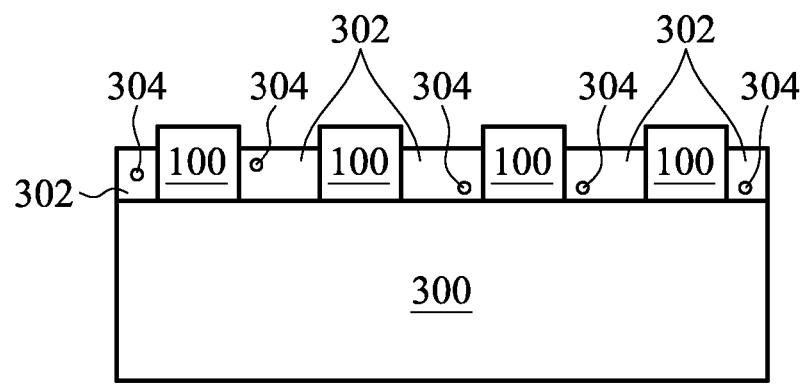
FIG. 4 illustrates a conventional step, wherein a molding compound is filled into the gaps between top dies.
Figure 5:
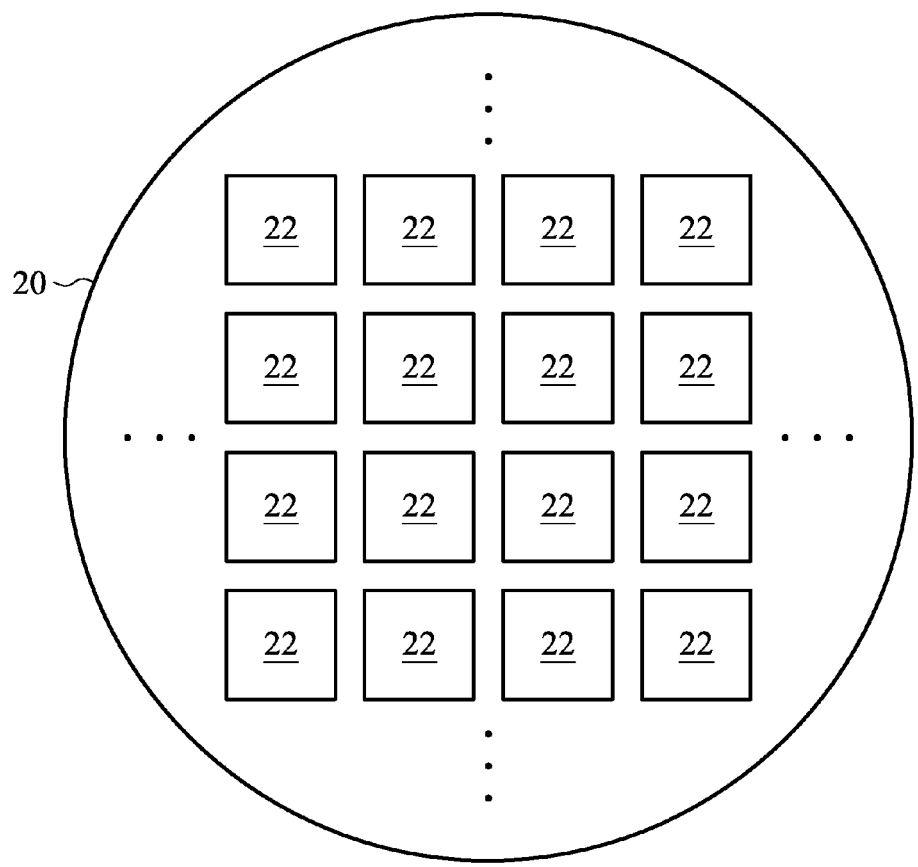
FIGS. 5-13 are cross-sectional views and top views of intermediate stages in a bonding process.

FIG. 5 is a top view of bottom wafer 20, on which (top) dies will be bonded. Bottom wafer 20 includes a plurality of bottom dies 22, which may be arranged, for example, in the style of an array with a plurality of rows and columns. The positions and sizes of bottom dies 22, particularly the relative positions of dies 22, are recorded for the formation of a patterned adhesive film, as will be discussed in subsequent paragraphs.

Figure 6:
Figure 7A:
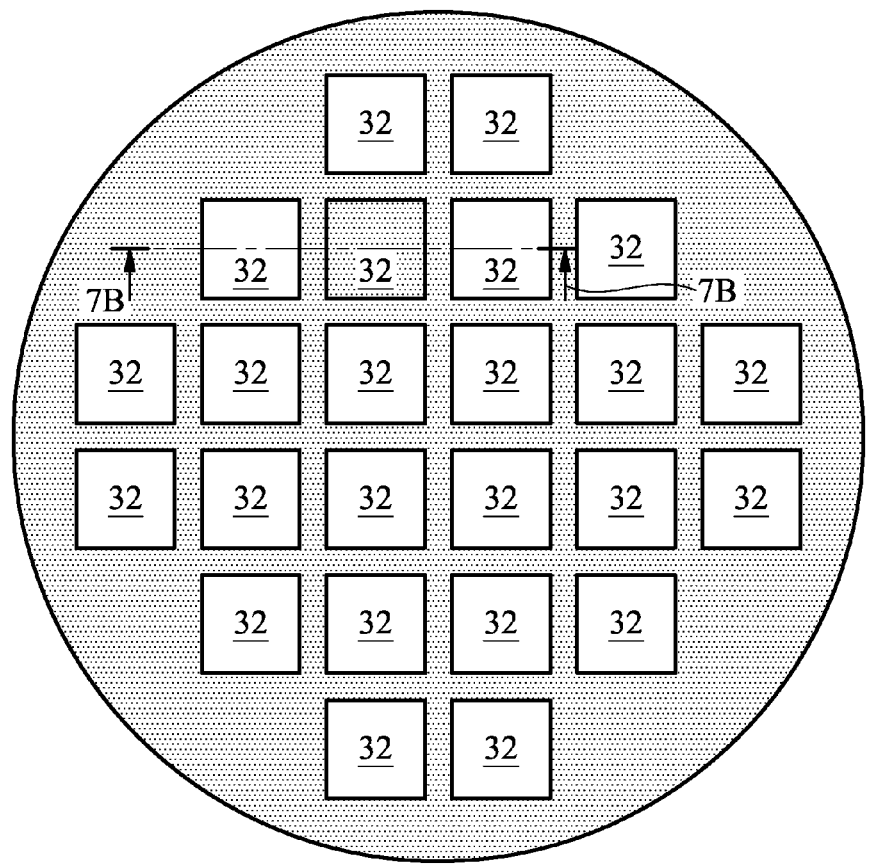
Figure 7B:
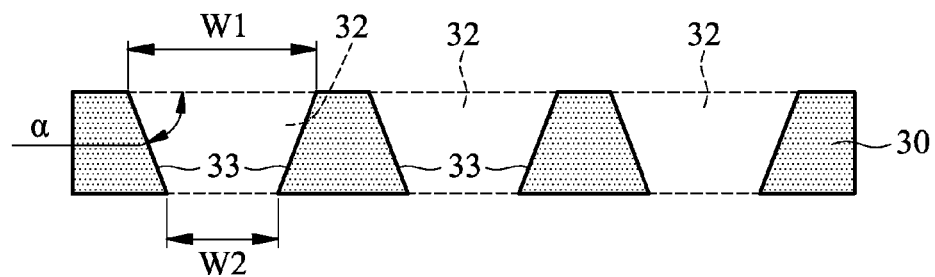
Figure 12:
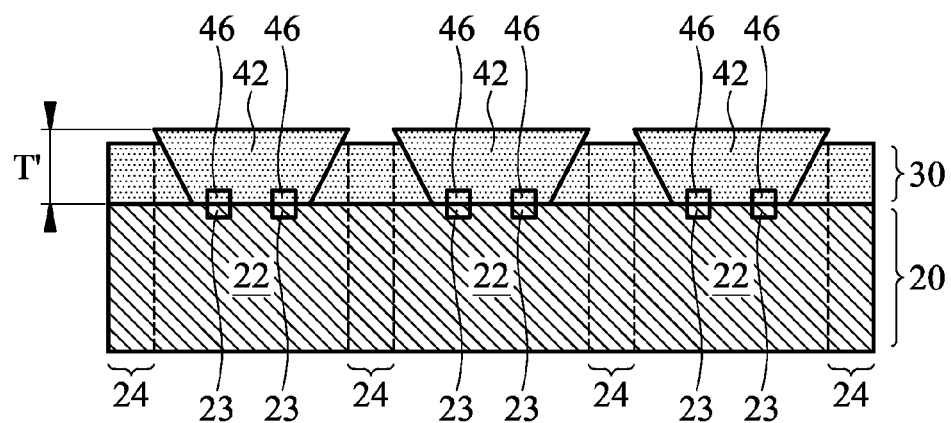

FIGS. 6, 7A and 7B illustrate the formation of patterned adhesive film 30. Referring to FIG. 6, a blank adhesive film 30 is provided. If viewed from the top, adhesive film 30 (refer to FIG. 7A) preferably has a substantially same size as bottom wafer 20 as shown in FIG. 5. Alternatively, blank adhesive film 30 may be larger or smaller than the size of bottom wafer 20. However, the size of adhesive film 30 is preferably great enough to cover all of the bottom dies 22. In the side view as shown in FIG. 6, blank adhesive film 30 appears as a sheet with a substantially uniform thickness T. In an embodiment, thickness T of the blank adhesive film 30 is close to the thickness T' of top dies as shown in FIG. 12, although thickness T may be greater or smaller than thickness T'. Blank adhesive film 30 may be formed of a flexible material, which may be a polymer such as polyimide (including, for example, a thermosetting polyimide that can be cured by heat), a dry film, or the like. In alternative embodiments, blank adhesive film 30 is a hard, non-flexible film.

FIGS. 7A and 7B are a top view and a cross-sectional view, respectively, of adhesive film 30 after the patterning to form die-holding openings 32. Die-holding openings 32 are through-openings extending from one side of adhesive film 30 to the opposite side. Referring to FIG. 7A, die-holding openings 32 are accurately aligned to the positions of bottom dies 22 as in FIG. 5, so that when adhesive film 30 is placed over bottom wafer 20, bottom dies 22 may be exposed through die-holding openings 32.

FIG. 7B illustrates a cross-sectional view of patterned adhesive film 30, wherein the cross-sectional view is taken along a plane crossing line 7B-7B in FIG. 7A. In an embodiment, die-holding openings 32 have slanted sidewalls 33, with the bottom width W2 being smaller than the top width W1. In other words, top slant angles α of die-holding openings 32 are less than 90 degrees. The preferred slant angle α is greater than about 45 degrees and smaller than 90 degrees. The details of the top slant angles α are discussed in subsequent paragraphs. In an embodiment of the present invention, top slant angle α is about 54.7 degrees, although other greater or smaller angles may also be used, depending on the shape of the top dies that will be filled into die-holding openings 32.

Figure 8:
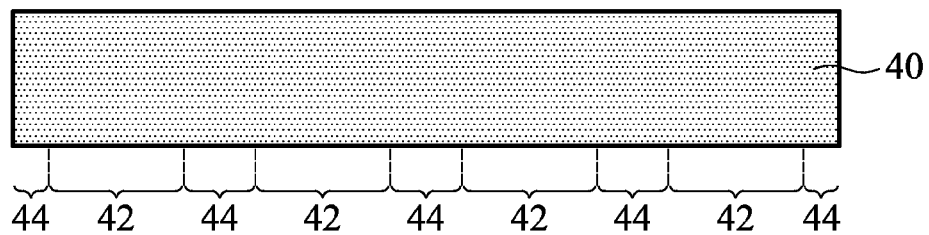
Figure 9:
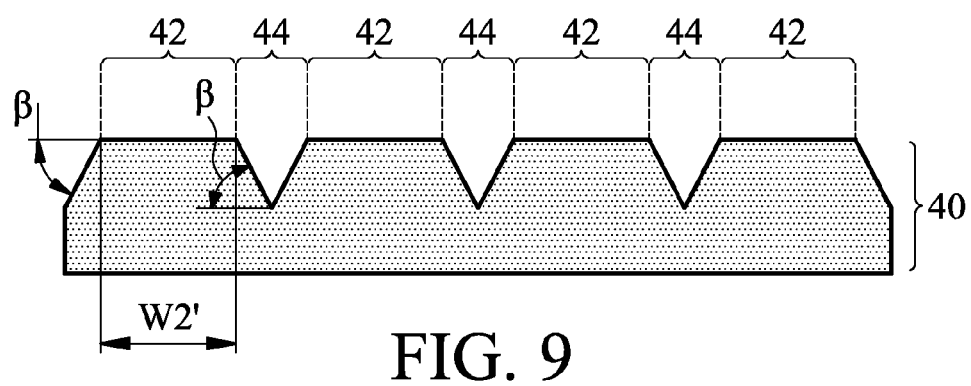
Figure 10:
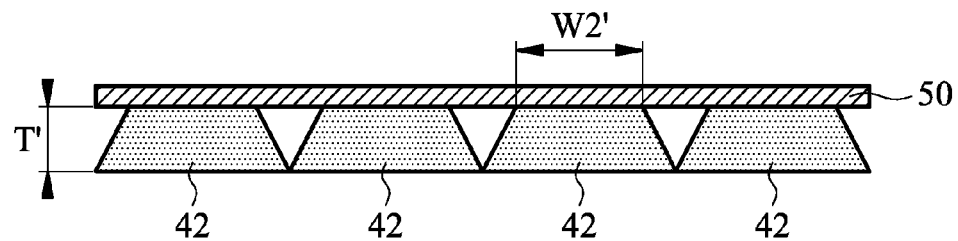

FIGS. 8 through 10 illustrate the separation of top dies 42 from top wafer 40. FIG. 8 illustrates a cross-sectional view of top wafer 40, which includes a plurality of top dies 42. In FIG. 9, top wafer 40 is etched. In an embodiment, the etching is performed to the front surface of top wafer 40, wherein the front surface is the surface having bond pads 46 (refer to FIG. 12) thereon. Top wafer 40 is etched along scribe lines 44. The etching is preferably anisotropic, or has both anisotropic and isotropic components. In an embodiment, an anisotropic etch is first performed, then the etching recipe is adjusted to add an isotropic component in order to form slanted edges for dies 42 with slant angle β. The etchant recipe may be adjusted to form different slant angles β. However, slant angle β and slant angle α as shown in FIG. 7B are preferably equal to each other. This may be achieved, for example, by determining etchant recipes to perform experimental etchings in order to find out the respective slant angles β. If a slant angle β is desirable, then adhesive film 30 is formed to make slant angle α equal to the desired slant angle β. After the etching, the top width W2' of top dies 42 is preferably equal to the bottom width W2 of die-holding openings 32 (refer to FIG. 7B), with as small a difference as possible.

Next, as shown in FIG. 10, glass wafer 50 (or a tape) is attached to the front surface of top dies 42, and the back surface of wafer 40 is grinded, until top dies 42 are separated from each other. The depth T' of the resulting dies 42 is preferably, although is not required to be, close to the thickness T of patterned adhesive film 30 (refer to FIG. 6). In an embodiment, top dies 42 are sorted, and known-good-dies 42 are placed into a die tray (not shown). In alternative embodiments, top dies 42 are left in the dicing frame, in which the die-sawing or laser separation is performed, for the subsequent bonding process.

Figure 11:
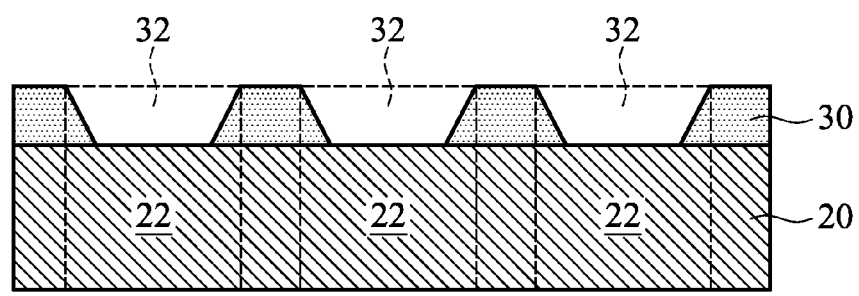

Referring to FIG. 11, patterned adhesive film 30 is laminated onto bottom wafer 20. An alignment is performed so that die-holding openings 32 are accurately aligned to bottom dies 22. As a result, bottom dies 22 are exposed through die-holding openings 32. The alignment may be performed by aligning the alignment marks on bottom wafer 20 with the alignment marks on patterned adhesive film 30. In an embodiment, the patterned adhesive film 30 itself is adhesive, and is reliably attached onto bottom wafer 20. In alternative embodiments, patterned adhesive film 30 is attached onto bottom wafer 20 through an adhesive.

Next, as shown in FIG. 12, a quick pick-and-place is performed to transfer top dies 42 into die-holding openings 32. This step is performed without any additional alignment step. Since the bottom width W2 of die-holding openings 32 (refer to FIG. 7B) is the same as the top width W2' of top dies 42 (refer to FIG. 10), top dies 42 are self-aligned to respective bottom dies 22. Particularly, when the sidewalls of top dies 42 and die-holding openings 32 are slanted, the self-alignment is more accurate, and the pick-and-place is easier. Further, the size of top dies 42 preferably matches the size of die-holding openings 32 as much as possible, so that no gap is left between top dies 42 and adhesive film 30. When a face-to-face bonding is performed, the bond pads 46 in top dies 42 are accurately aligned to bond pads 23 in bottom dies 22. The bonding may be direct metal-to-metal bonding, or through a thin layer of solder.

After die-holding openings 32 are filled with top dies 42, a bonding is performed, during which an annealing may be performed, and a pressure may be applied to press top dies 42 against bottom wafer 20. Top dies 42 are thus bonded onto bottom wafer 20. In an embodiment, the annealing also causes the curing of the patterned adhesive film 30, and hence the patterned adhesive film 30 is solidified. In alternative embodiments, after the step of bonding, an additional curing may be performed, wherein the additional curing may include one or more steps of ultra-violet (UV) curing, heating, and the like, and combinations thereof. Advantageously, the cured patterned adhesive film 30 acts as the molding compound that otherwise would be filled into the gaps between top dies 42 in the liquid form.

Figure 13:
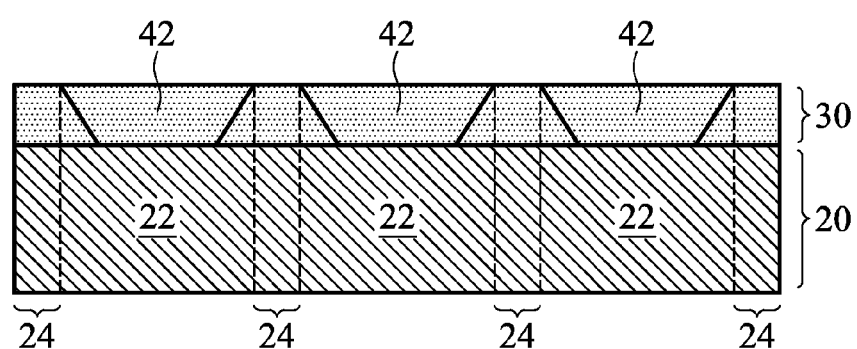

Optionally, after the bonding of top dies 42 and the curing of the patterned adhesive film 30, a grind/polish step may be performed to level the back surface of patterned adhesive film 30 and the back surfaces of top dies 42. The resulting structure is shown in FIG. 13. It is noted that the back surfaces of top dies 42 may be higher than, substantially level with, or lower than, the top surface of patterned adhesive film 30. The polish may thus create a flat surface for subsequent process steps. In an alternative embodiment, no grinding/polish is performed, and the structure as shown in FIG. 12 may be sawed as is. FIGS. 12 and 13 illustrate the scribe lines 24, through which the bottoms dies 22, top dies 42 and the patterned adhesive film 30 are sawed apart. After the sawing, each of the resulting dies will include a bottom die 22, a top die 42, and a portion of adhesive film 30 on the bottom die 22 and encircling top die 42.

In above-discussed embodiments, direct metal-to-metal bonding or solder bonding (with little solder) may be used. However, it is realized that the embodiments of the present invention may be used to perform any other bonding techniques such as dielectric-to-dielectric bonding. In addition, one skilled in the art, with the teaching provided in the embodiments of the present invention, may realize the formation details of other bonding schemes, such as face-to-back bonding, back-to-back bonding, and the like.

The embodiments of the present invention have several advantageous features. By forming patterned adhesive film 30 with die-holding openings 32 accurately aligned to bottom dies 22 in bottom wafer 20, only one alignment needs to be performed to align patterned adhesive film 30 to bottom wafer 20, while top dies 42 may be quickly picked and placed into die-holding openings 32, which has the function of self-aligning top dies 42 to the respective bottom dies 22. The throughput is thus significantly improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
   a bottom die comprising:
      a major top surface; and
      a first edge and a second edge perpendicular to the major top surface, wherein the first edge and the second edge are opposite edges of the bottom die;
   a top die bonded onto the bottom die, wherein the top die has a slanted edge neither parallel to nor perpendicular to the major top surface of the bottom die; and
   a filler material on the bottom die and encircling the top die, wherein the filler material comprises:
      a third edge contacting the slanted edge; and
      a fourth edge and a fifth edge perpendicular to the major top surface of the bottom die, wherein the fourth edge and the first edge are connected with each other to form a first continuous straight edge, and wherein the fifth edge and the second edge are connected with each other to form a second continuous straight edge.

2. The integrated circuit structure of claim 1, wherein the filler material is adhesive and is able to be formed as a laminate film when uncured, and wherein the filler material has a strength to withstand a polish when cured.

3. The integrated circuit structure of claim 2, wherein the filler material comprises a polyimide.

4. The integrated circuit structure of claim 1, wherein a top surface of the top die is level with a top surface of the filler material.

5. The integrated circuit structure of claim 1, wherein a top surface of the top die is lower than a top surface of the filler material.

6. The integrated circuit structure of claim 1, wherein the top die has a narrower side and a wider side farther away from the bottom die than the narrower side.

7. The integrated circuit structure of claim 1, wherein the bottom die is a portion of an un-sawed wafer, and wherein the top die is a discrete die.

8. An integrated circuit structure comprising:
   a bottom wafer comprising a plurality of bottom dies, and scribe lines between the plurality of bottom dies;
   a plurality of top dies over the bottom wafer, wherein each of the plurality of top dies is bonded to one of the plurality of bottom dies, and wherein a bottom portion of each of the plurality of top dies has a bottom width smaller than a respective top width of a top portion of the each of the plurality of top dies, and wherein the top width and the bottom width are measured in a direction parallel to a major surface of bottom wafer; and
   a filler material over the bottom wafer and filling spaces between the plurality of top dies, wherein the filler material contacts sidewalls of the plurality of top dies.

9. The integrated circuit structure of claim 8, wherein the plurality of top dies is bonded to the plurality of bottom dies through flip-chip bonding.

10. The integrated circuit structure of claim 8, wherein the filler material comprises:

first portions directly over, and vertically overlapping, the scribe lines of the bottom wafer; and second portions directly over, and vertically overlapping, portions of the plurality of bottom dies of the bottom wafer.

11. The integrated circuit structure of claim 8, wherein the filler material comprises polymer.

12. The integrated circuit structure of claim 8, wherein the filler material has characteristics of being solid and adhesive before annealed, and has a strength that can withstand a polish to the filler material and the plurality of top dies after annealed.

13. The integrated circuit structure of claim 8, wherein the filler material has a top surface lower than top surfaces of the plurality of top dies.

14. The integrated circuit structure of claim 8, wherein the filler material has a top surface level with top surfaces of the plurality of top dies.

15. An integrated circuit structure comprising:
a bottom wafer comprising a plurality of bottom dies, and scribe lines between the plurality of bottom dies;
a plurality of top dies over the bottom wafer and bonded to the plurality of bottom dies; and
a laminate film adhered to the bottom wafer and comprising:
first portions directly over, and vertically overlapping, the scribe lines of the bottom wafer; and
second portions directly over, and vertically overlapping, the plurality of bottom dies of the bottom wafer, wherein the second portions contact sidewalls of the plurality of top dies to form slant edges.

16. The integrated circuit structure of claim 15, wherein the plurality of top dies is bonded to the plurality of bottom dies through flip-chip bonding, wherein each of the plurality of top dies has a bottom portion, and a top portion farther away from the bottom wafer than the bottom portion, and wherein a width of the bottom portion is smaller than a width of the top portion.

17. The integrated circuit structure of claim 15, wherein the plurality of top dies is located in openings of the laminate film.

18. The integrated circuit structure of claim 15, wherein the slant edges form slant angles equal to about 54.7° with a top surface of the laminate film.

19. The integrated circuit structure of claim 15, wherein the laminate film comprises a polymer.

20. The integrated circuit structure of claim 15, wherein the laminate film has a strength to withstand a polish to the laminate film after curing.

* * * * *